United States Patent
Uskali et al.

(10) Patent No.: US 6,735,423 B1
(45) Date of Patent: May 11, 2004

(54) METHOD AND APPARATUS FOR OBTAINING OPTIMAL PERFORMANCE IN A RECEIVER

(75) Inventors: Robert Uskali, Schaumburg, IL (US); William C. Hart, Jr., Huntley, IL (US); Brian Iehl, Hoffman Estates, IL (US)

(73) Assignee: General Instrument Corporation, Horsham, PA (US)

(*) Notice: Subject to any disclaimer, the term of this patent is extended or adjusted under 35 U.S.C. 154(b) by 0 days.

(21) Appl. No.: 09/313,730

(22) Filed: May 18, 1999

(51) Int. Cl.[7] .................................................. H04B 1/06
(52) U.S. Cl. .................................. 455/249.1; 455/232.1
(58) Field of Search .......................... 455/249.1, 226.1, 455/232.1, 234.1, 240.1, 47, 241.1, 307, 136, 250.1, 161.1; 375/130; 348/731, 735, 725

(56) References Cited

U.S. PATENT DOCUMENTS

| | | | |
|---|---|---|---|
| 4,539,707 A | * 9/1985 | Jacobs et al. | 455/47 |
| 5,572,264 A | * 11/1996 | Mizukami et al. | 348/735 |
| 5,732,341 A | * 3/1998 | Wheatley, III | 455/234.1 |
| 5,909,645 A | * 6/1999 | Abramsky et al. | 455/249.1 |
| 5,933,770 A | * 8/1999 | Heiter | 455/307 |
| 5,999,559 A | * 12/1999 | Takaki | 375/130 |
| 6,032,031 A | * 2/2000 | Takaki | 455/245.2 |

FOREIGN PATENT DOCUMENTS

JP          09247561       9/1997

* cited by examiner

*Primary Examiner*—Temica M. Davis
*Assistant Examiner*—Erika Gary
(74) *Attorney, Agent, or Firm*—Mayer Fortkort & Williams; Heather L. Mansfield

(57) ABSTRACT

In a channelized system having a plurality of channels, an input spectrum having a plurality of signals is received by a receiver (10). A first attenuation value (V1) is applied to a first variable gain device (12) and a second attenuation value (V2) is applied to a second variable gain device (14), wherein the first variable gain device (12) and the second variable gain device (14) are within a common signal path. The receiver (10) is tuned to a desired channel and a first power level is measured within the desired channel. The receiver (10) is selectively tuned to at least one additional channel and a second power level within the at least one additional channel is measured, independent of the first power level. Based on measuring the power levels, a first modified attenuation value is applied to the first variable gain device (12) and a second modified attenuation value is applied to the second variable gain device (14).

23 Claims, 4 Drawing Sheets

METHOD AND APPARATUS FOR OBTAINING OPTIMAL PERFORMANCE IN A RECEIVER

FIELD OF THE INVENTION

The present invention relates generally to a method and apparatus for obtaining optimal performance in a receiver employing an automatic gain control system.

BACKGROUND OF THE INVENTION

Cable television (CATV) receivers, such as set-top boxes, cable modems and cable telephony devices, employ automatic gain control (AGC) systems to provide constant power levels at the demodulator input. Within the AGC system, the power of the incoming signal within the desired channel is measured and used as a control parameter. Typically, incoming signals within channel assignments surrounding the desired channel may differ in amplitude, modulation type and presence. Since most existing AGC systems monitor only the amplitude of the incoming signal within the desired channel, non-optimal receiver performance is obtained given this limited view of the entire spectrum of incoming signals.

Thus, there exists a need to provide a method and apparatus that obtains optimal performance in a receiver employing an automatic gain control system.

BRIEF DESCRIPTION OF THE DRAWINGS

A preferred embodiment of the invention is now described, by way of example only, with reference to the accompanying drawings in which.

DETAILED DESCRIPTION OF THE PREFERRED EMBODIMENT

The preferred embodiment of the present invention provides a method and apparatus that obtains optimal performance in a receiver employing an automatic gain control (AGC) system, such as, but not limited to, set-top boxes, cable modems, cable telephony devices, devices compatible with data over cable service interface specification (DOCSIS), etc. The preferred embodiment of the present invention collects the desired channel information and surrounding channel information (contiguous or non-contiguous to the desired channel) during periods when the receiver is not in use for its primary purpose, with a new channel data collection algorithm. By monitoring amplitudes and modulation types of incoming signals within a set of channels to determine the total input power and power spectrum distribution, the AGC circuits (identified below) are adjusted to maximize the signal-to-noise ratio in lightly loaded systems and minimize distortion products in heavily loaded systems. For ease of explanation, the channels and the composite input spectrum are part of a channelized cable television (CATV) system, but could be part of any channelized system.

Until the channel characterization is complete, default AGC control settings (described below) are used. After the channel characterization data is collected, it is interpreted by an algorithm (preferably implemented via a microprocessor) that in turn sets the variable gain devices of the receiver for optimal receiver performance based on knowledge of the desired channel in conjunction with knowledge of the surrounding channels.

With the implementation of the present invention, improved receiver performance is realized by providing higher signal-to-noise ratios and/or improved rejection of in-band spurious signals, such as composite triple beats (CTBs) and composite second order (CSO) responses. In the case of digital signal reception, the present invention provides higher data throughput and improved channel impairment rejection. In the case of analog video reception, the present invention provides improved signal quality. A further advantage of the present invention is that the method is applicable to existing receiver circuitry as well as custom-made receiver circuitry or circuitry that may be either entirely or partially integrated on a semiconductor integrated circuit. Moreover, the same mechanism (e.g., a power detector (described below)) that is used to measure the power level within a desired channel is also used to measure the composite input spectrum with individual channel power measurements, as opposed to measuring the power level within a bandwidth covering multiple channels at the same time.

Figure 1:
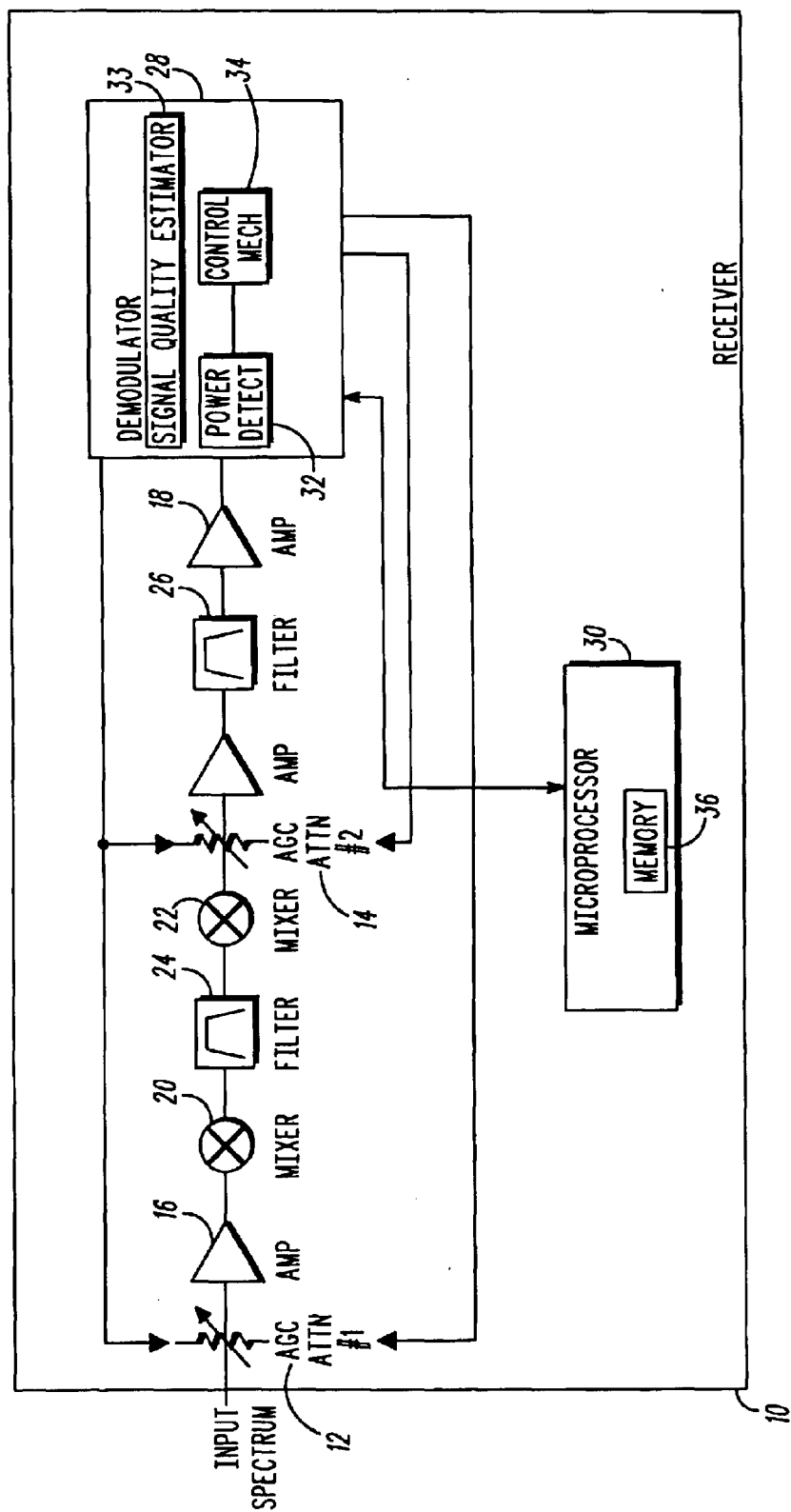
FIG. 1 illustrates a block diagram of an example of a dual automatic gain control (AGC) receiver line-up according to the preferred embodiment of the present invention.

The present invention is applicable to a number of different component variations for a receiver employing an AGC system, but for purposes of this discussion, the receiver comprises the components as shown in FIG. 1. FIG. 1 illustrates a simplified block diagram of an example of a receiver 10 employing an AGC system according to the preferred embodiment of the present invention. The receiver 10 comprises at least two variable gain devices 12, 14, a power detector 32, a control mechanism 34 and a microprocessor 30 (collectively referred to as the AGC system in the preferred embodiment of the present invention). These components can reside in the receiver 10 as discrete components or combined components with any other compatible component of the receiver 10. Preferably, the variable gain devices 12, 14 are within a common signal path and are preferably variable attenuators, but could also be variable gain amplifiers. Moreover, the function of the microprocessor 30 can be implemented in application specific integrated circuit (ASIC) or any other applicable discrete circuit or existing circuitry.

Typically, other components are present within the receiver 10, such as amplifiers 16, 18, mixers 20, 22, filters 24, 26 and a demodulator 28 depending on the system configuration. These components and their functionality are commonly known to a person of ordinary skill in the art, and thus will not be discussed.

In the preferred embodiment of the present invention, the power detector 32 and the control mechanism 34 reside in the demodulator 28, but could be located elsewhere in the receiver. The power detector 32 provides a means to measure the incoming signal level. Based on the incoming signal level, the control mechanism 34 sets the variable gain devices 12, 14 in a closed-loop algorithm that in turn sets the desired signal level into the demodulator 28 to a predetermined power level (hereinafter referred to as a default AGC algorithm). As the incoming signal level varies, the control mechanism 34 adjusts the variable gain devices 12, 14 within the closed-loop control system by applying a first and second attenuation value (V1 and V2) in decibels (dB) to the variable gain devices 12, 14, respectively, to maintain a constant power level at the demodulator 28.

Figure 2:
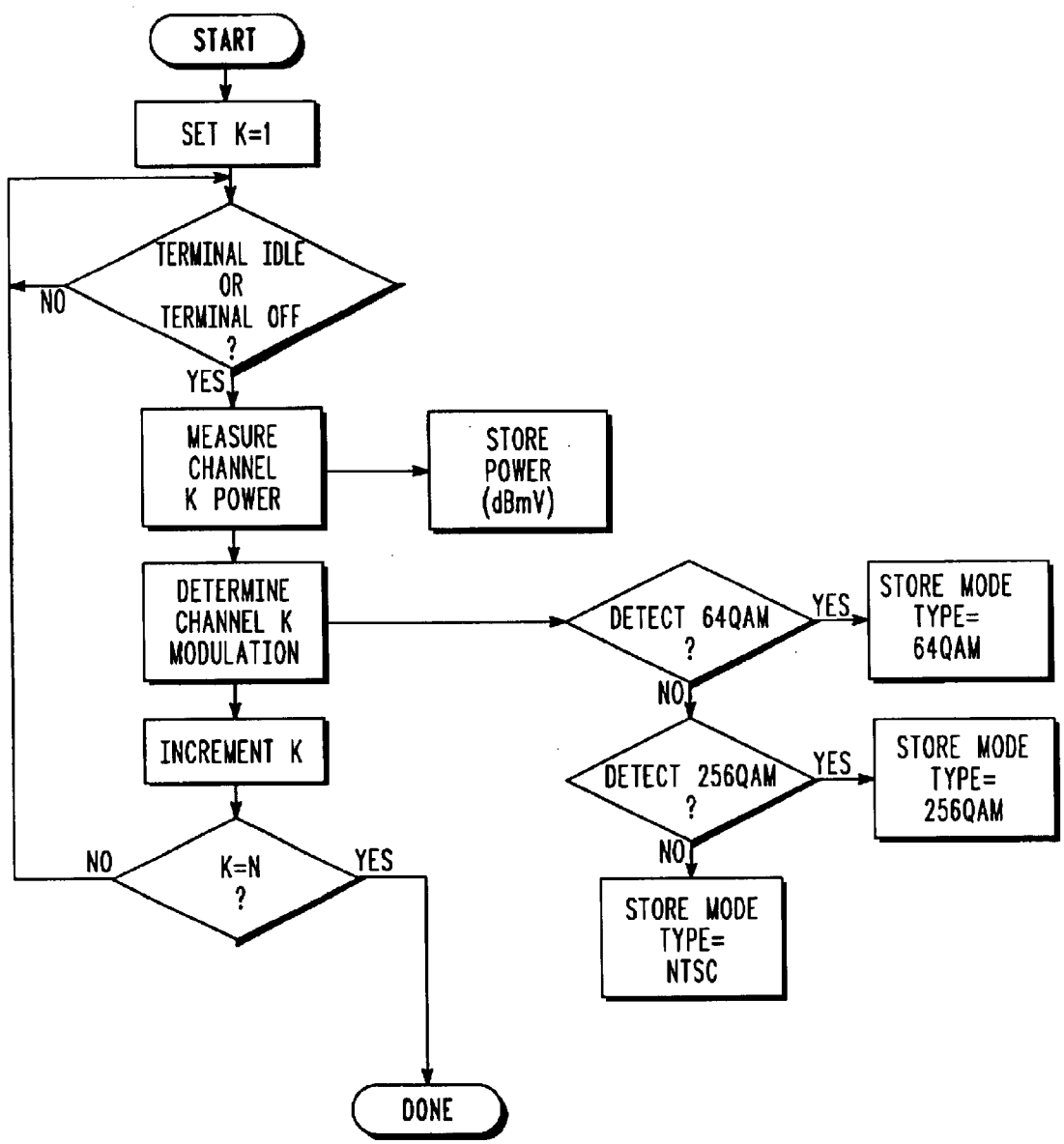
FIG. 2 illustrates a flowchart diagram of an input spectrum characterization according to the preferred embodiment of the present invention.

FIG. 2 illustrates a flowchart diagram of an input spectrum characterization for the receiver 10 according to the preferred embodiment of the present invention. Preferably, the input spectrum characterization is performed by the microprocessor 30 as a low-priority background process (i.e., not real-time). The receiver 10 is methodically tuned to each channel (K=1, 2, . . . , N−1, N) where the input power and modulation type (e.g., 64 QAM, 256 QAM, vestigial sideband (VSB)-amplitude modulation (AM), 8 VSB, 16 VSB, orthogonal frequency division multiplexing (OFDM) or any other channelized modulation format) of each channel are measured, classified and stored within the receiver's memory 36 during periods when the receiver 10 is not used for its primary function, such as power-on, channel scanning, downstream idle time or receive terminal (e.g., television or computer) non-use.

If a request for use of the receiver 10 is received, the input spectrum characterization is temporarily halted to prevent disruption for normal receiver 10 use. It should be noted that AGC optimization cannot take place until sufficient channel characterization is complete. Since CATV signals are relatively static, only periodic characterization of the channels is required. In a wireless system, however, more frequent characterization of channels may be required or characterizing a smaller subset of the total available channels (e.g., the image frequency).

Figure 3:
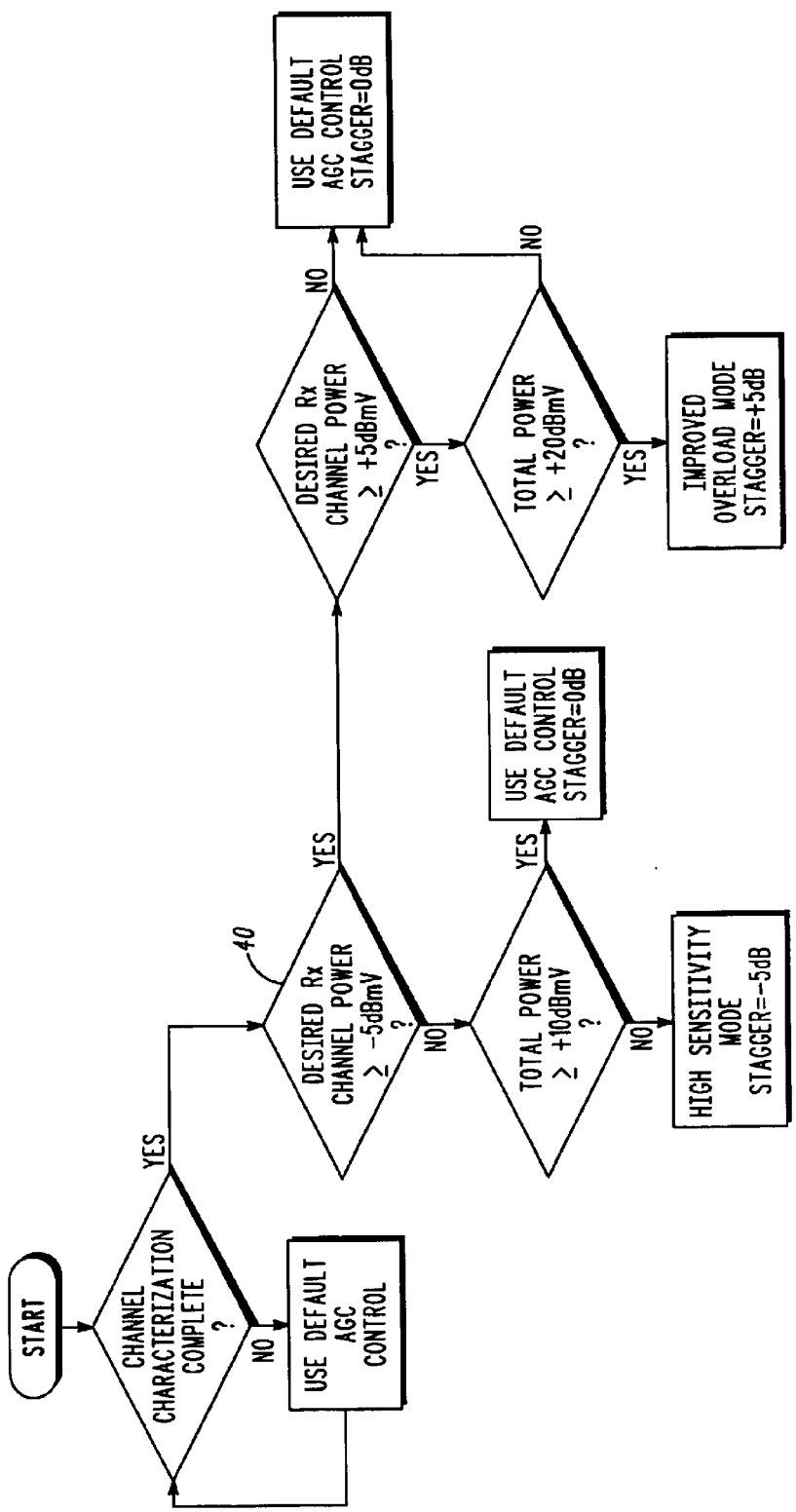
FIG. 3 illustrates a flowchart diagram of an example of dual AGC algorithm according to the preferred embodiment of the present invention.

FIG. 3 illustrates a flowchart diagram of an example of an AGC control algorithm performed in the microprocessor 30 according to the preferred embodiment of the present invention. Until sufficient channel characterization is complete, the default AGC algorithm is used. Once the input channels are sufficiently characterized, the variable gain devices 12, 14 are set for optimal receiver 10 performance. The microprocessor 30 retrieves the stored input power for the desired channel and compares the input power for the desired channel against a first threshold at decision block 40. For purposes of this discussion, the first threshold is set at −5 dBmV, but this value is system configurable.

If the input power for the desired channel is less than the first threshold value, the microprocessor 30 calculates the total power of the input spectrum and compares the total power against a second threshold value. For purposes of this discussion, the second threshold value is +10 dBmV, but this value is also system configurable.

The total input power is the summation of the power level within the desired channel plus the power level within surrounding channels (either the entire input spectrum or some subset thereof). During input spectrum characterization, individual signal average power measurements are taken. This average power reading is then adjusted by a known peak-to-average constant based on the modulation type to determine the signal peak power. It is this signal peak power value that is used in the calculation of the total input power of the composite input spectrum. If peak power signal measurements are available, these power values are summed directly. Alternatively, if a means to determine modulation type is not available or not used, average power levels are summed to calculate the total input power.

The amount of input power within the desired channel and the amount of total power of the input spectrum determine whether a positive parameter stagger or a negative parameter stagger is applied to the variable gain devices 12, 14. A parameter stagger is defined as the amount of attenuation (in decibels) by which the variable gain devices 12, 14 are offset with respect to V1 and V2, respectively. If the total power of the input spectrum is greater than or equal to the second threshold value, the amount of attenuation applied to the variable gain devices 12, 14 remain the same, V1 and V2. If the total power of the input spectrum is less than the second threshold value, the microprocessor 30 forces the receiver 10 into a "high-sensitivity" mode.

In the high-sensitivity mode, a negative parameter stagger is applied to the variable gain devices 12, 14. A negative parameter stagger is defined as removing attenuation from the first variable gain device 12 and adding attenuation to the second variable gain device 14 with respect to the amount of attenuation currently being applied to the variable gain devices 12, 14 (V1 and V2). For example, with a negative parameter stagger, a stagger value C is subtracted from V1 and applied to the first variable gain device 12 and the stagger value C is added to V2 and applied to the second variable gain device 14 (how the stagger value C is derived is described below). As a result, the microprocessor 30 applies a first modified attenuation value of V1−C to the first variable gain device 12 and a second modified attenuation value of V2+C to the second variable gain device 14. Since an equal amount of attenuation is removed from V1 and added to V2, the resulting signal level at the demodulator 28 remains constant.

Figure 4:
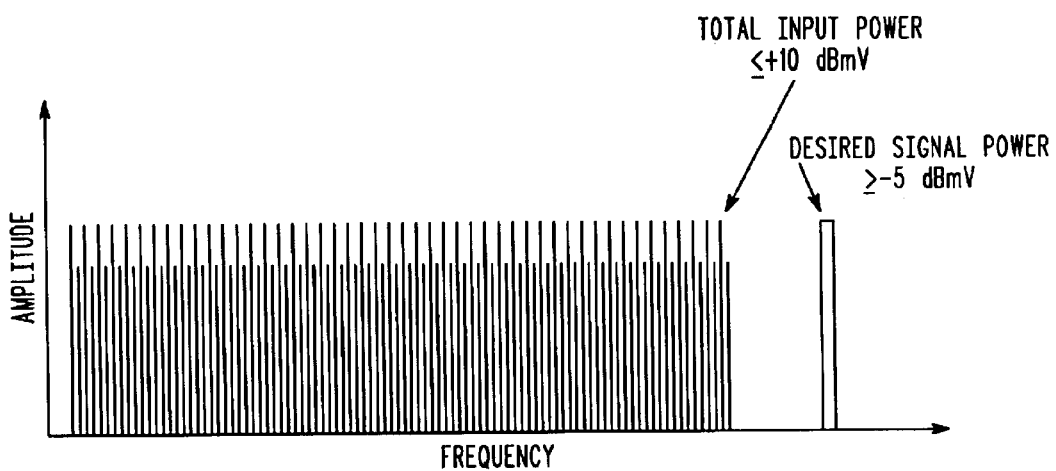
FIG. 4 illustrates an example of an input spectrum in a lightly loaded system according to the preferred embodiment of the present invention.

In general, a negative parameter stagger provides for an improved desired signal-to-noise ratio operation on a more lightly loaded system. FIG. 4 is an example of a composite input spectrum on a lightly loaded system. A lightly loaded system characterized by a low total power level may be the result of either relatively few surrounding signals or relatively low desired and surrounding signal levels. In either case, the composite input spectrum entering the receiver 10 is less likely to produce undesired intermodulation products within the receiver's non-linear devices, such as the amplifiers 16, 18 and mixers 20, 22, thereby allowing a higher desired signal level to be processed in the receiver 10 in stages up to the second variable gain device 14. By processing a higher level desired signal, a higher signal-to-noise ratio is obtained.

Referring back to decision block 40 of FIG. 3, if the input power of the desired channel is greater than the first threshold value, the microprocessor 30 compares the input power of the desired channel against a third threshold value. For purposes of this discussion, the third threshold value is +5 dBmV, but this value is system configurable and greater than the first threshold value. If the input power within the desired channel is less than the third threshold value, the first and second variable gain devices 12, 14 operate in the default mode with an attenuation value of V1 and V2, respectively. If the input power within the desired channel is greater than the third threshold value, the microprocessor 30 calculates the total power of the input spectrum and compares the total power against a fourth threshold value. For purposes of this discussion, the fourth threshold value is +20 dBmV, but this value is system configurable. If the total power of the input spectrum is less than or equal to the fourth threshold value, again the first and second variable gain devices 12, 14 operate in the default mode with an attenuation value of V1 and V2, respectively. If the total power of the input spectrum is greater than the second threshold value, the microprocessor 30 forces the receiver 10 into an "improved-overload" mode.

In an improved-overload mode, a positive parameter stagger is applied to the variable gain devices 12, 14. A positive parameter stagger is defined as adding attenuation to the first variable gain device 12 and subtracting attenuation from the second variable gain device 14 with respect to the amount of attenuation applied to the variable gain devices 12, 14 from the default AGC algorithm (V1 and V2). For example, with a positive parameter stagger, a stagger value C is added to V1 and applied to the first variable gain device 12 and the stagger value C is subtracted from V2 and applied to the second variable gain device 14. As a result, the microprocessor 30 applies a first modified attenuation value of V1+C to the first variable gain device 12 and a second modified attenuation value of V2−C to the second variable gain device 14. Since an equal amount of attenuation is added to V1 and removed from V2, the resulting signal level at the demodulator 28 remains constant.

Figure 5:
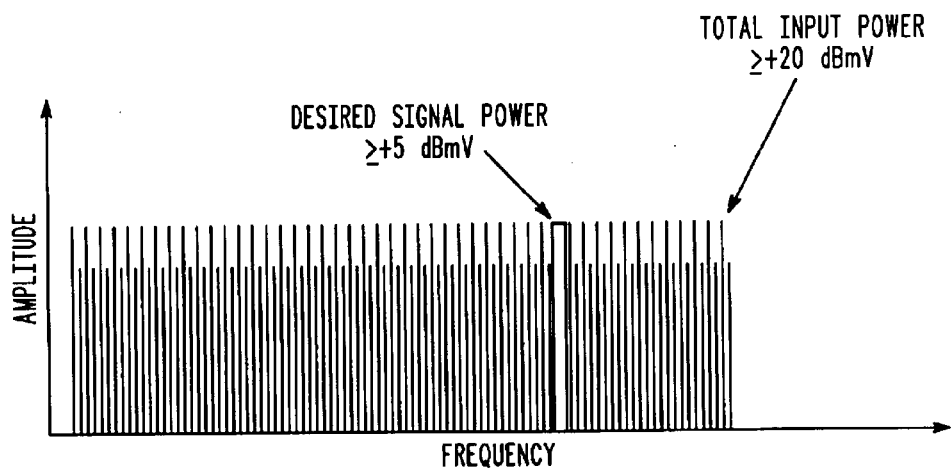
FIG. 5 illustrates an example of an input spectrum in a heavily loaded system according to the preferred embodiment of the present invention.

In general, a positive parameter stagger provides better operation in heavily loaded systems where CTB and CSO or other intermodulation products become more troublesome. FIG. 5 is an example of a composite input spectrum in a heavily loaded system. A heavily loaded system characterized by high total input power is the result of one or more input signals being at a relatively high power level. In this case, the composite input spectrum entering the receiver 10 is more likely to produce undesired intermodulation products within the receiver's 10 non-linear devices, such as the amplifiers 16, 18 and mixers 20, 22. If a high desired signal is present within the high level composite input spectrum, it is possible to process the composite input spectrum in the receiver 10 in stages up to the second variable gain device 14 at a lower level relative to the default AGC algorithm setting. By processing a lower level composite input spectrum, less undesirable intermodulation products are produced. Since the incoming desired signal is determined to be high, a reduction in power level in the receiver 10 in stages up to the second variable gain device 14 will not result in a significant degradation of desired signal-to-noise ratio.

The AGC stagger value C is chosen to provide optimal receiver performance. The stagger value may be either fixed or dynamic. A fixed stagger value is predetermined and does not change during receiver operation. The fixed stagger value C is chosen based on the characteristics of the composite input spectrum and the receiver 10 itself. A design analysis is done which considers the characteristics of the incoming signals, such as minimum and maximum levels, and the characteristics of receiver stages represented by parameters, such as gain, noise figure, and intercept point. Based on this analysis, a fixed stagger value C is chosen which will minimize intermodulation distortions in heavily loaded systems and maximize the signal-to-noise ratio in lightly loaded systems. The details of this analysis are not provided here since each system and receiver 10 will have specific considerations that cannot be addressed in a general discussion. Those skilled in the art and familiar with the system and receiver characteristics will be able to perform such and analysis and select an appropriate stagger value C.

Alternately, a dynamic stagger value C may be used. In this case, the stagger value C is dynamically modified during receiver 10 operation based on measured receiver performance performed by a signal quality estimator 33 within the demodulator 28. For example, the demodulator 28 within the receiver 10 may be equipped with a means of estimating the desired input signal signal-to-noise ratio (SNR). An algorithm within the microprocessor 30 is used to modify the stagger value C by a predetermined amount while monitoring the resulting change in the desired SNR estimate provided by the demodulator 28. If an improved SNR estimate is obtained, a further change to the stagger value C may be performed. Alternately, if a degraded SNR estimate is obtained, the stagger value C may be changed in the opposite direction. After any change, if no significantly improved SNR estimate is obtained, the stagger value C optimization search algorithm is temporarily halted and the best obtained stagger value may be used. The algorithm may be restarted periodically or may be trigger by events, such as a receiver channel change. Other similar algorithms which actively search and optimize the receive SNR may be implemented. A similar algorithm may be implemented using other receiver performance indicators, such as bit error rate (BER), or any combination of power levels, SNR, BER or any other receiver performance parameters.

This technique of dynamically modifying the ACG stagger value is not limited to using receiver performance indicators that originate within the receiver 10. For example, in a CATV system where the receiver 10 containing the modified AGC system is located in a subscriber device, such as a cable modem, the headend equipment may have a means of monitoring the receiver performance. This receiver performance data may be transmitted to the modem from the headend for use in the dynamically optimized stagger value algorithm as described.

In addition to the AGC control algorithm described in FIG. 3, other features may be implemented in the present invention. In other alternative embodiments, additional power switching thresholds and stagger depths may be added. Depending on the design of the receiver 10, signals immediately surrounding the desired signal may have a greater impact on producing intermodulation products. For example, immediately surrounding signals, such as the six signals commonly referred to in the industry as the adjacent, alternate, and second alternate signals, both above and below the desired signal, may not be filtered or removed from the desired signal during initial receiver stage processing. As a consequence, these six signals plus the desired signal must pass through potentially more receiver stages as compared to the entire composite input spectrum. In this case, the calculated total input power is adjusted or weighed more heavily to compensate for both the amplitude and presence of the immediately surrounding signals. In other cases, any selected channels contiguous or not to the desired signal within the composite input spectrum may be weighed more heavily based on a predetermined knowledge of the receiver architecture, e.g., measuring the signal at the image frequency.

Also, consideration of neighboring signal types may be added to the AGC control algorithm described in FIG. 3. Typical means of power measurement in the demodulator 28 results in an average power reading. Digital modulation signals, such as 64 QAM, have a higher peak-to-average power ratio as compared to an analog modulation signal, such as VSB-AM. In order to minimize intermodulation distortions within the receiver 10, signal peak powers must be known. With signal peak powers known, the AGC system adjusts the incoming signal levels to prevent stage overload thereby minimizing intermodulation distortions.

While the invention has been described in conjunction with a specific embodiment thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

We claim:

1. In a channelized communication system having a plurality of channels, a method for obtaining optimal performance in a receiver comprising:

receiving an input spectrum having a plurality of signals and an input spectrum bandwidth;

applying a first attenuation value to a first variable gain device;

applying a second attenuation value to a second variable gain device, wherein the first variable gain device and the second variable gain device are within a common signal path;

tuning the receiver to a first channel, the first channel having a first bandwidth within, and less than, the input spectrum bandwidth;

measuring a first power level within the first channel;

successionally tuning the receiver to a second channel, the second channel having a second bandwidth within, and less than, the input spectrum bandwidth;

measuring a second power level, independent from the first power level, within the second channel; and based on the steps of measuring, applying a first modified attenuation value to the first variable gain device and applying a second modified attenuation value to the second variable gain device.

2. A method in accordance with claim 1 further comprising determining a modulation type for a desired signal within the first channel and at least one additional signal within the second channel.

3. A method in accordance with claim 2 further comprising:

calculating a peak power based on the modulation type of and the power level within the second channel; and wherein the step of applying is further based on the step of calculating.

4. A method in accordance with claim 1 further comprising dynamically modifying the first modified attenuation value and the second modified attenuation value during receiver operation based on the steps of measuring.

5. A method in accordance with claim 1 further comprising dynamically modifying the first modified attenuation value and the second modified attenuation value during receiver operation based on a bit error rate of a desired signal within the first channel.

6. A method in accordance with claim 1 further comprising dynamically modifying the first modified attenuation value and the second modified attenuation value during receiver operation based on a signal to noise ratio of a desired signal within the first channel.

7. A method in accordance with claim 1 wherein the first and second power levels are peak power levels.

8. A method in accordance with claim 1 wherein the first and second power levels are average power levels.

9. A method in accordance with claim 1 wherein a positive stagger is applied to the first and second variable gain devices in a heavily loaded system, wherein an output of the first variable gain device is coupled to an input of the second variable gain device and wherein the positive stagger adds an attenuation value to the first variable gain device and subtracts the attenuation value from the second variable gain device.

10. A method in accordance with claim 1 wherein a negative stagger is applied to the first and second variable gain devices in a lightly loaded system, wherein an output of the first variable gain device is coupled to an input of the second variable gain device and wherein the negative stagger subtracts an attenuation value from the first variable gain device and adds the attenuation value to the second variable gain device.

11. A method in accordance with claim 1 further comprising:

determining whether the power level within the first channel is greater than a first threshold; and determining whether a total power level within the first channel and the second channel in combination is greater than a second threshold.

12. A method in accordance with claim 1 further comprising storing the power levels within and modulation types of the first channel and the second channel.

13. A method in accordance with claim 1 further comprising determining that the receiver is idle prior to the steps of measuring.

14. A method in accordance with claim 1 wherein the first modified attenuation value is greater than the first attenuation value and the second modified attenuation value is less than the second attenuation value.

15. A method in accordance with claim 1 wherein the first modified attenuation value is less than the first attenuation value and the second modified attenuation value is greater than the second attenuation value.

16. In a channelized communication system having a plurality of channels, an apparatus for obtaining optimal performance in a receiver comprising:

an input for receiving an input spectrum having a plurality of signals and an input spectrum bandwidth;

a first variable gain device having a first attenuation value;

a second variable gain device having a second attenuation value, wherein the first variable gain device and the second variable gain device are within a common signal path;

a means for successionally tuning the receiver to a first channel, the first channel having a first bandwidth within, and less than the input spectrum bandwidth;

a power detector for measuring a first power level within the first channel and a second power level, independent of the first power level, within a second channel;

a microprocessor, coupled to the power detector, for receiving the first power level and the second power level, and based on the first power level and the second power level, varying the first attenuation value applied to the first variable gain device with a first modified attenuation value and varying the second attenuation value applied to the second variable gain device with a second modified attenuation value; and a control mechanism, coupled to the first and second variable gain devices, the power detector and the microprocessor, for applying the first and second attenuation values to the first and second variable gain devices.

17. An apparatus in accordance with claim 16 wherein the first and second variable gain devices are attenuators.

18. An apparatus in accordance with claim 16 wherein the first and second variable gain devices are amplifiers.

19. An apparatus in accordance with claim 16 wherein the first variable gain device is an attenuator and the second variable gain device is an amplifier.

20. An apparatus in accordance with claim 16 further comprising a control mechanism for determining a modulation type of a signal within the first channel and the second channel.

21. An apparatus in accordance with claim 16 wherein the power detector and the control mechanism reside inside of a demodulator.

22. An apparatus in accordance with claim 16 further comprising a signal quality estimator, coupled to the microprocessor, for providing an estimate of signal quality of a desired signal to the microprocessor.

23. An apparatus in accordance with claim 16 wherein the power detector is operable when the receiver is idle.

* * * * *

UNITED STATES PATENT AND TRADEMARK OFFICE
CERTIFICATE OF CORRECTION

PATENT NO.   : 6,735,423 B1
DATED        : May 11, 2004
INVENTOR(S)  : Robert Uskali et al.

It is certified that error appears in the above-identified patent and that said Letters Patent is hereby corrected as shown below:

Column 5,
Line 62, before "analysis" change "and" to -- an --.

Column 6,
Line 14, change "trigger" to -- triggered --.

Signed and Sealed this

Tenth Day of August, 2004

JON W. DUDAS
*Acting Director of the United States Patent and Trademark Office*